United States Patent [19]

Takemoto et al.

[11] Patent Number: 5,661,066
[45] Date of Patent: Aug. 26, 1997

[54] SEMICONDUCTOR INTEGRATED CIRCUIT

[75] Inventors: Toyoki Takemoto, Yawata; Haruyasu Yamada; Tsutomu Fujita, both of Hirakata; Tadao Komeda, Ikoma, all of Japan

[73] Assignee: Matsushita Electric Industrial Co., Ltd., Kadoma, Japan

[21] Appl. No.: 965,967

[22] Filed: Apr. 2, 1991

Related U.S. Application Data

[62] Division of Ser. No. 440,479, Nov. 21, 1989, abandoned, which is a continuation of Ser. No. 331,882, Dec. 17, 1981, abandoned.

[30] Foreign Application Priority Data

Dec. 17, 1980  [JP]  Japan .................. 55-179449
Dec. 17, 1980  [JP]  Japan .................. 55-179450
Dec. 17, 1980  [JP]  Japan .................. 55-179451
Dec. 26, 1980  [JP]  Japan .................. 55-186393

[51] Int. Cl.$^6$ ................... H01L 21/265; H01L 21/70; H01L 27/00
[52] U.S. Cl. ................ 438/329; 438/324; 438/357
[58] Field of Search ............... 437/31, 32, 33, 437/38, 51, 52, 54, 55, 60, 904, 919, 47, 149, 150; 148/DIG. 14, DIG. 87, DIG. 174; 257/296, 297, 298, 299, 300, 532, 533, 534, 535

[56] References Cited

U.S. PATENT DOCUMENTS

| | | | |
|---|---|---|---|
| 3,581,164 | 5/1971 | Pfander | 357/51 |
| 3,615,932 | 10/1971 | Makimoto et al. | 148/175 |
| 3,770,519 | 11/1973 | Wiedmann | 437/904 |
| 3,802,968 | 4/1974 | Ghosh et al. | 148/175 |
| 3,841,918 | 10/1974 | Agraz-Guerena et al. | 148/1.5 |
| 3,865,648 | 2/1975 | Castrucci et al. | 437/149 |
| 3,881,179 | 4/1975 | Howard, Jr. | 357/13 |
| 3,919,005 | 11/1975 | Schinella et al. | 148/157 |
| 3,936,856 | 2/1976 | Magdo . | |
| 3,959,040 | 5/1976 | Robertson | 357/51 |
| 4,047,195 | 9/1977 | Allison | 357/55 |
| 4,086,610 | 4/1978 | Clark et al. | 357/34 |
| 4,131,497 | 12/1978 | Feng et al. | 148/187 |
| 4,161,743 | 7/1979 | Yonezawa et al. | 357/54 |
| 4,197,147 | 4/1980 | Bergmann et al. . | |

(List continued on next page.)

FOREIGN PATENT DOCUMENTS

| | | | |
|---|---|---|---|
| 2515707 | 12/1975 | Germany . | |
| 2715158 | 10/1978 | Germany . | |
| 2835330 | 2/1980 | Germany | 357/92 |
| 3005384 | 8/1980 | Germany . | |
| 3026779 | 2/1981 | Germany . | |
| 53-121587 | 10/1978 | Japan | 357/92 |
| 55-85076 | 6/1980 | Japan | 357/48 |
| 56-81961 | 7/1981 | Japan | 357/14 |
| 56-142661 | 11/1981 | Japan | 357/92 |
| 2056768 | 3/1981 | United Kingdom | 357/92 |

OTHER PUBLICATIONS

IBM Technical Disclosure Bulletin, vol. 19, No. 7, Dec. 1976, N.Y., N.G. Anantha et al. "Fabrication of I2L circuits", pp. 2514–2516.
Patent Abstracts of Japan, vol. 1, No. 145, 25 Nov. 1972, pp. 7317E77 and JP-A-52-83078.

*Primary Examiner*—John Niebling
*Assistant Examiner*—Brian K. Dutton
*Attorney, Agent, or Firm*—Cushman, Darby & Cushman IP group of Pillsbury Madison & Sutro LLP

[57] ABSTRACT

In an integrated circuit comprising an IIL and a high frequency npn bipolar transistor which has a deep p⁻-type base region 45 for its inverted npn output transistors, circuit elements such as a resistor part R, a capacitor part C, a diode part D and an isolated crossing connection part Cr are provided with deep p⁻-type regions 54, 54', 65', 71 and 82 which are formed at the same time with the p⁻-type region 45 in the IIL, and thereby, reliability of the circuit elements as well as characteristic thereof are improved, thereby further improving manufacturing yields.

4 Claims, 10 Drawing Sheets

U.S. PATENT DOCUMENTS

| | | | |
|---|---|---|---|
| 4,211,941 | 7/1980 | Schade, Jr. | 357/14 |
| 4,214,252 | 7/1980 | Goerth | 357/23 |
| 4,228,448 | 10/1980 | Lalumia et al. | |
| 4,302,691 | 11/1981 | Kelley | 307/592 |
| 4,325,180 | 4/1982 | Curran | |
| 4,386,327 | 5/1983 | Ogawa | 331/108 |
| 4,400,865 | 8/1983 | Goth et al. | 29/571 |
| 4,404,738 | 9/1983 | Sasaki et al. | 357/92 |

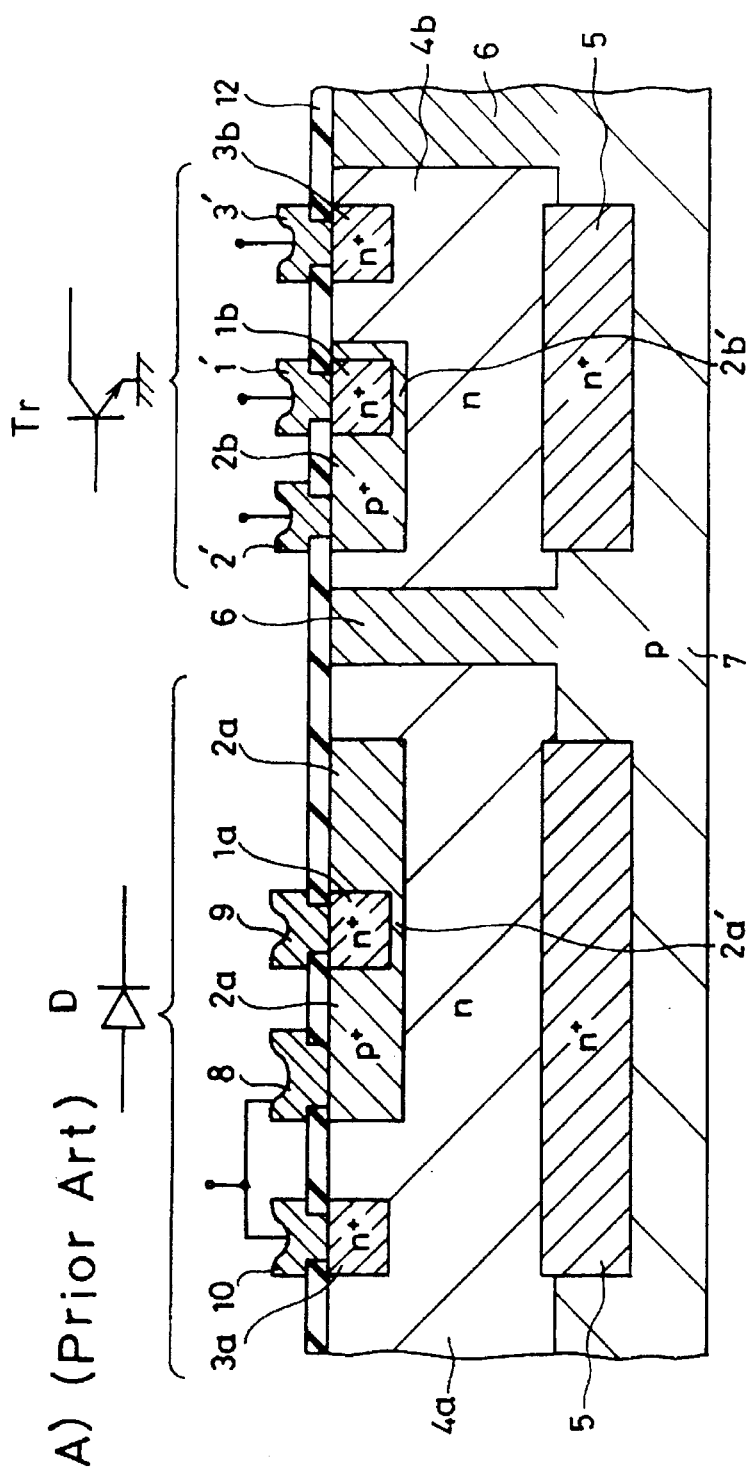
FIG.1 (A) (Prior Art)
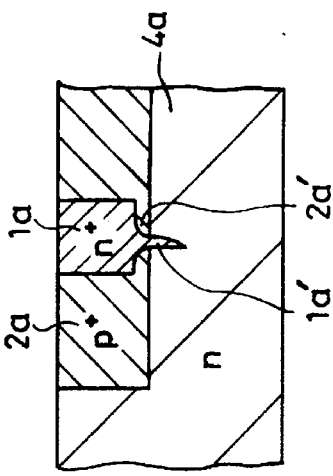
FIG.1 (B) (Prior Art)

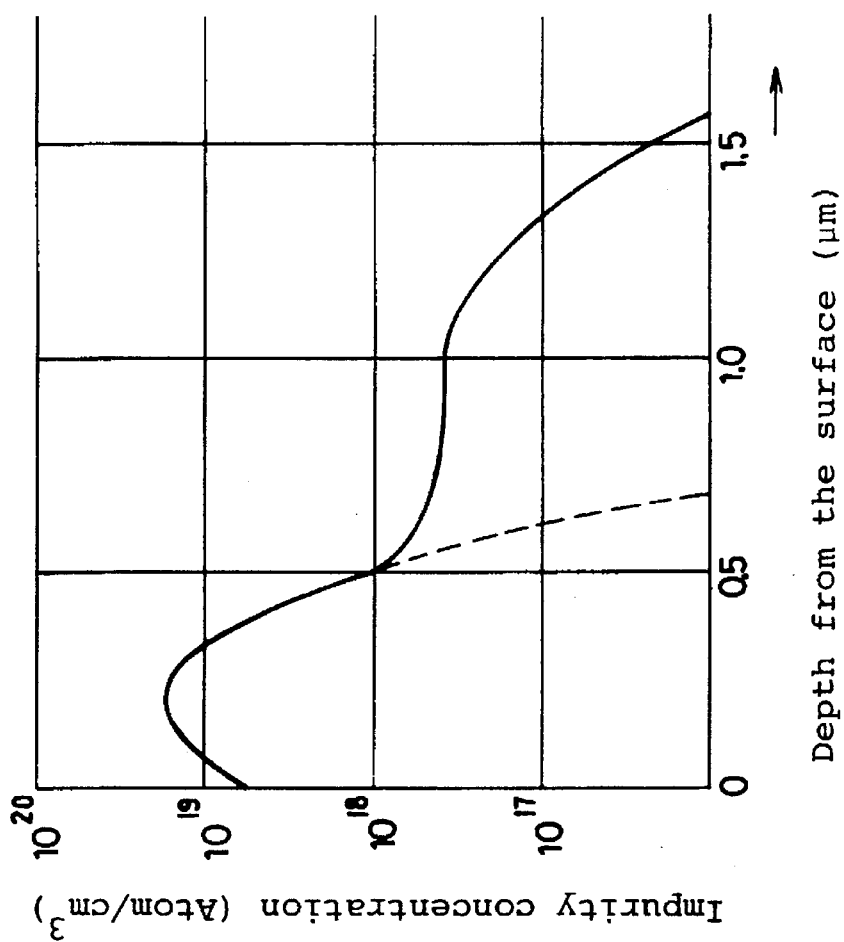
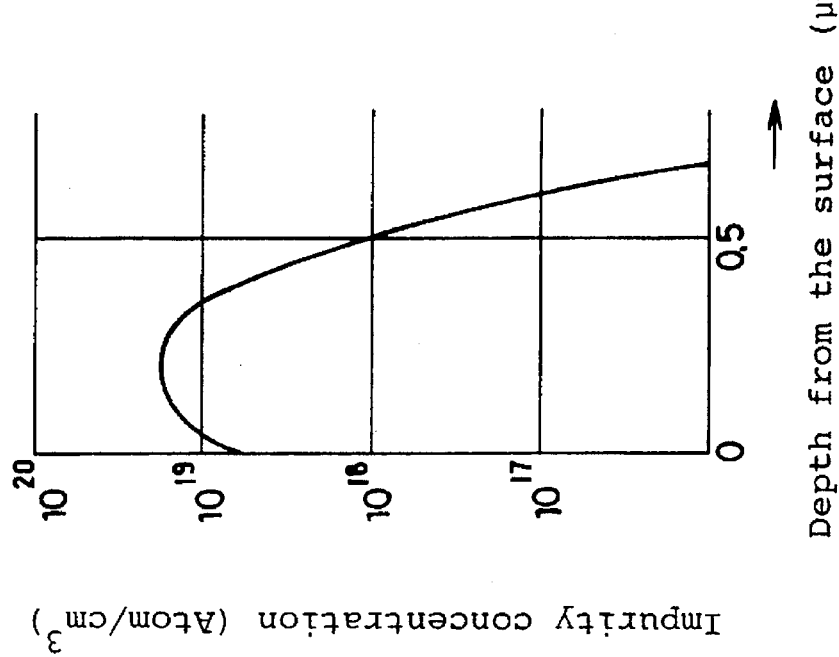

SEMICONDUCTOR INTEGRATED CIRCUIT

This is a division of application Ser. No. 07/440,479, filed on Nov. 21, 1989, which was abandoned upon the filing hereof; which is a continuation of Ser. No. 06/331,882 filed Dec. 17, 1981, now abandoned.

BACKGROUND OF THE INVENTION

1. Field of the Invention

The present invention relates to semiconductor integrated circuits, and especially concerns those semiconductor integrated circuits which include at least an integrated injection logic and a high frequency bipolar transistor.

2. Prior Art

Integrated circuits are recently made to contain the integrated injection circuits and bipolar transistors of pnp and npn types, and further, resistors, diodes, capacitors, isolated crossing connection regions, and so on.

In general, inactive circuit elements such as diodes, capacitors and isolated crossing connection regions are formed at the same time when making bipolar transistors. That is to say, these elements are made for example by the following steps:

forming a p$^+$-type diffused region of a medium impurity concentration in an n-island region, at the same time with forming of the base regions of npn bipolar transistors, the island regions being formed at the same time with forming of island regions serving as the collectors of the npn bipolar transistors, and then forming an n$^+$-type diffused region of a high impurity concentration in the p$^+$-type diffused region, at the same time with forming of the emitter regions of the npn bipolar transistors.

In such conventional forming of the diodes, capacitors and isolated crossing connection regions, there have been liabilities of defects of undesirable leakages between the n$^+$-type diffused regions and the n-type island regions thereby lowering the production yield of the ICs (the leakages are hereinafter referred as CE leak since they are leakages between the n$^+$-type diffused regions formed at the same time with the emitter regions and the n-type island regions formed at the same time with the collector regions). Furthermore, the resistors, which are generally formed by the p$^+$-type layer, have been liable to defects of time-deteriorations of insulation and voltage dependency of their resistances.

The cause and circumstances of the above-mentioned defects of the conventional ICs are elucidated more in detail in the following with reference to FIG. 1(A), FIG. 1(B), FIG. 2, FIG. 3 and FIG. 4 showing various parts of such conventional integrated circuits.

FIG. 1(A) shows a part of a sectional elevation view of the conventional IC, comprising a high frequency bipolar transistor at the right half part and a diode at the left half part. In the IC, a p-type silicon substrate comprises epitaxially formed island regions 4a and 4b isolated each other by the isolation regions 6, 6 . . . of p$^+$-type, the region 4b serving as the collector region of the high frequency bipolar transistor. In the island regions 4a and 4b, p$^+$-type region 2a of the diode and the p$^+$-type base region 2b of the bipolar transistor are formed at the same time by a known diffusion process. Then n$^+$-type regions 3a, 1a, 1b and 3b are formed by a known diffusion process to have shallower depth than that of the p$^+$-type regions 2a and 2b. The n$^+$-type region 1b formed in the base region 2b serves as the emitter region, the n$^+$-type region 3b formed in the collector region 4b serves as a collector contact region, the n$^+$-type region 1a formed in the p$^+$-type region 2a forms n$^+$-region of the diode and the n$^+$-type region 3a formed in the n-type island region 4a serves as a contact region therefor. Buried regions of n$^+$-type 5, 5 are formed between the bottoms of the n-type island regions 4a and 4b and the p-type substrate region 7. Electrodes 1', 2' and 3' are the electrodes of the emitter, the base and the collector, respectively. Electrodes 8, 9 and 10 are the electrodes of the diode. The electrodes are formed through openings of an insulation film 12.

In the above-mentioned construction of the conventional IC, the n$^+$-type region 1a of the diode part is formed at the same time with the diffusion of the emitter region 1b, and the depth and impurity concentration of these two regions 1a and 1b are the same. Similarly, the depth and the concentration of the p$^+$-type regions 2a and 2b are the same. On the other hand, for attaining a good high-frequency characteristics, thickness of the active base region 2b' which is a difference of the depths of the p$^+$-type region 2b and the n$^+$-type region 1b is designed very thin, for example about 0.2 μm. Therefore, as a result of the design to make the active base region 2b' thin, the thickness of the remaining part 2a' of the p$^+$-type region 2a under the n$^+$-type region 1a becomes also about 0.2 μm. The problem of the such thin remaining part 2a' is that, when the diffusion front of the n$^+$-type part 1a undesirably makes a partially deep diffusion 1a' as shown in FIG. 1(B) to penetrate the thin remaining part 2a', the diode formed by the p-n junction between the n$^+$-type region 1a and the p$^+$-type region 2a makes the aformentioned CE leak, thus making shortcircuiting in logic circuit and resultant defects in the IC. Such CE leak is likely to be caused by crystal defect in the semiconductor layer, oxide-induced stacking fault (O.S.F) or precipitation of heavy metal. Since the IC generally has as similar large number as that of the transistors, such defects are fatal to the IC. Thus, the CE leak in the diode part has been a large problem in manufacturing yield of IC industry.

FIG. 2 shows another part of the conventional IC, where an isolated crossing connection region is formed and the undesirable CE leak is likely to occur causing defect of the IC. The isolated crossing connection region is formed mainly by an n$^+$-type region 1a' and auxiliarily by a p$^+$-type region 2a'+2a", and electrodes 13 and 14 are connected to both regions at the opposite ends thereof. Over the surface of the n$^+$-type region 1a', the insulation film 12, for example, SiO$_2$ film, is formed, and over the insulation film 12a metal wiring 15 is formed, in a manner to be isolated from the connection regions 1a' and 2a' and crossing over them. In this construction, a p-n junction between the p$^+$-type region 2a'+2a" and the n$^+$-type region 4a is used negatively biased so as to isolate the connection region 2a'+2a" from the island region 4a'. Since the n$^+$-type region 1a' and the p$^+$-type region 2a'+2a" are formed simultaneously with the n$^+$-type emitter region 1b and the p$^+$-type base region 2b, respectively, of the high frequency npn bipolar transistor of FIG. 1(A), the bottom part of the p$^+$-type region 2a' is formed very thin, similarly as the active base region 2b of the bipolar transistor of FIG. 1(A). Accordingly, the thin part 2a' is likely to be penetrated by irregular deep part of diffusion front of the n$^+$-type region 1a', thereby resulting in undesirable CE leak of the isolated crossing connection region, and resultant defect of IC function.

FIG. 3 shows another part of the conventional IC, where a capacitor is formed and the undesirable CE leak is likely to occur causing defect of the IC. The capacitor is formed by a p-n junction between the n$^+$-type region 1a and the p$^+$-type region 2a, and electrodes 17 and 18 are connected thereto. Capacitances of the capacitors in the IC should be around 30 PF, and such capacitance requires a size of about 100 μm×100 μm or more. In the conventional construction, where the $p^+$-type region 2a and the $n^+$-type region 1a are formed simultaneously with forming of the $p^+$-type base region 2b and the $n^+$-type emitter region 1b, respectively, the remaining part 2a' of the $p^+$-type region under the bottom of the $n^+$-type 1a is very thin, and therefore the thin remaining part 2a' is likely to be penetrated by irregular deep part of diffusion front of the $n^+$-type region 1a'. Thereby undesirable CE leak in the capacitor is formed resulting in leakage current and poor insulation part in the capacitor. Such CE leak makes defect of IC function.

FIG. 4 shows another part of the conventional IC, where a resistor is formed and the undesirable CE leak is likely to occur. The resistor is formed by a $p^+$-type diffused region 23 which is formed, for example, simultaneously with the $p^+$-type base region 2b of the bipolar transistor of FIG. 1(A). Electrodes 25 and 25' are connected to both ends of the $p^+$-type region 23 through the insulation film of, for example, $SiO_2$.

Firstly the resistor part of the IC has such a problem that the insulation of the resistor is determined by the insulation at the part of the peripheral bottom part 26, not by that at the flat bottom part 27 of the $p^+$-type region. This is because the intensity of electric field becomes highest at the peripheral bottom part, especially when the diffused region 23 is shallow. Therefore, it is necessary to eliminate such weak point. Secondly the resistor of the IC has a problem of stability of the resistance. The epitaxial region 22 and the $p^+$-type diffused region 23 form a p-n junction inbetween, and therefore, depletion layer grows both into the $p^+$-type region 23 and n-type region 22 from the p-n junction 27, and the growths of the depletion layers are dependent to the voltage applied to the p-n junction 27. When the applied voltage becomes higher, the depletion layer grows more, and resultantly, the effective depth of the $p^+$-type region 23 becomes shallower. Thus, the effective resistance of the resistor in the IC is dependent on the voltage applied across the electrodes 25 and 25', and this causes a grave problem.

SUMMARY OF THE INVENTION

Accordingly the present invention purports to provide an improved construction of the integrated circuit, whereby enables to solve the above-mentioned problems of the conventional integrated circuit, wherein highly reliable performance and improved characteristics are obtainable.

A semiconductor integrated circuit in accordance with the present invention comprises:

an integrated injection logic, a bipolar transistor, and at least one other electric circuit element formed on a semiconductor substrate having the integrated injection logic and the high frequency bipolar transistor thereon, characterized in that the above-mentioned other electric circuit element comprises a deeper region of a first conductivity type and a lower impurity concentration, the deeper region having substantially the same depth as, the same conductivity type as and substantially the same impurity concentration as those of the base region of the integrated injection logic a shallower region of the first conductivity type and a higher impurity concentration having substantially the same depth as, the same conductivity type as and substantially the same impurity concentration as those of the base region of the bipolar transistor.

The above-mentioned other electric circuit elements may be capacitor, resistor, diode, isolated crossing connections, etc., and as a result of the above-mentioned construction the higher reliabilities and improved characteristics of the IC as well as higher yield of manufacturing are achievable.

BRIEF EXPLANATION OF THE DRAWING

FIG. 1(A) is the sectional elevation view showing the construction of some parts of the conventional IC.

FIG. 1(B) is the sectional elevation view of a part of the conventional IC of FIG. 1(A) for explanation of the CE leak.

FIG. 6(A) is a graph showing distribution of impurity concentration with respect to depth from the surface of a part of the conventional IC.

FIG. 6(B) is a graph showing distribution of impurity concentration with respect to depth from the surface of a part of the IC embodying the present invention.

DESCRIPTION OF PREFERRED EMBODIMENTS

The inventors of the present invention nave proposed construction of IC including an integrated injection logic and a bipolar transistor in a preceding application in the United States (U.S. Ser. No. 167764), wherein base region of the integrated injection logic is formed by a deeper diffusion with a lower impurity concentration and subsequently the injectors of the integral injection logic and the base region of a bipolar transistor are simultaneously formed by a shallower diffusion with a higher impurity concentration.

In the present invention, other deeper diffused regions with the lower impurity concentration are formed in the above-mentioned other electric circuit element such as a resistor, a capacitor, diode, isolated crossing connection region, etc., and it was found that many practical advantages are derived therefrom.

EXAMPLE 1

Figure 5:
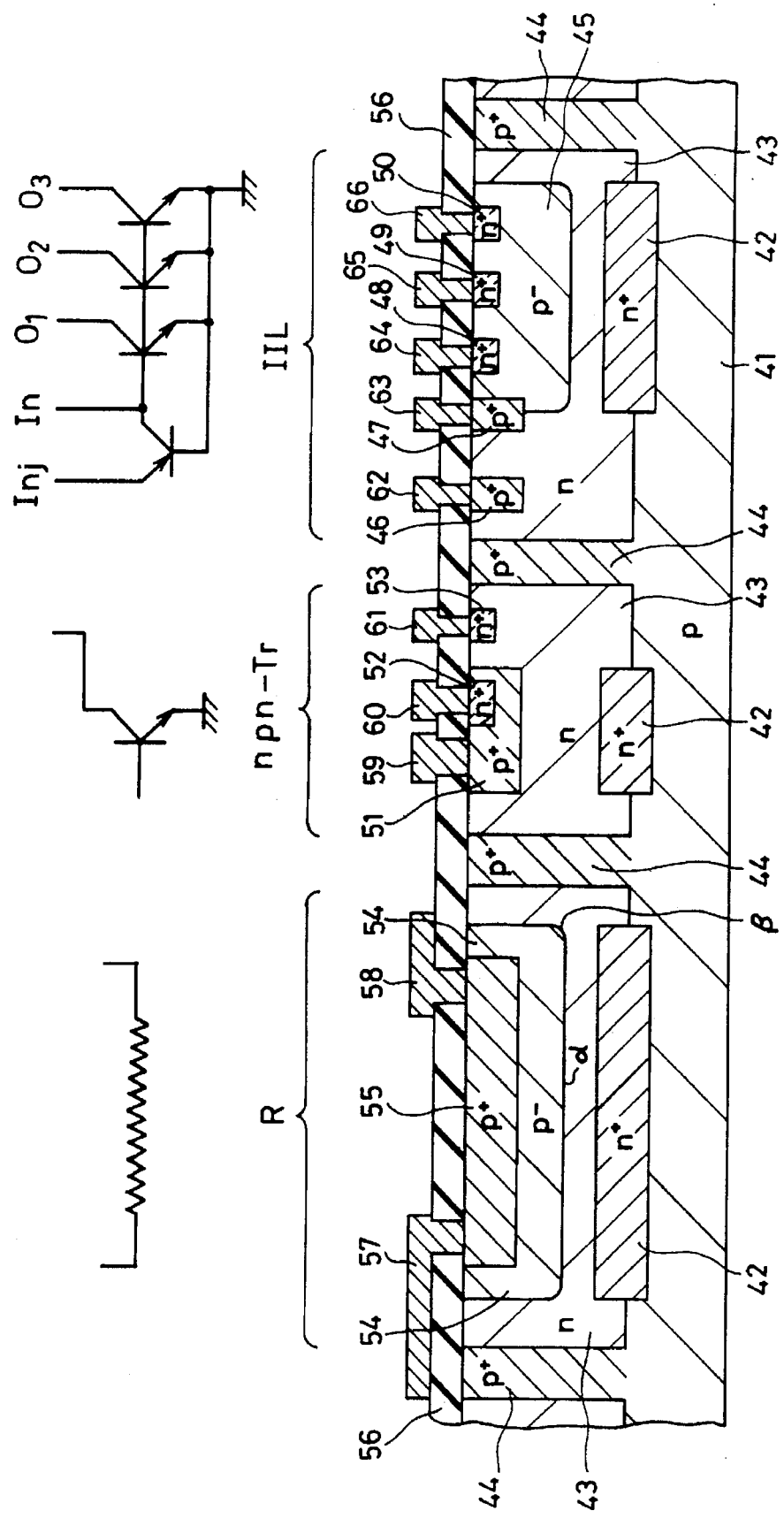
FIG. 5 is a sectional elevation view showing the construction of some parts of an integrated circuit embodying the present invention.

FIG. 5 shows construction of a first example, wherein the left part shows a resistor part, the center part shows a high frequency npn bipolar transistor and the right part shows an integrated injection logic having fan-out of three.

On a p-type silicon substrate having resistivity of about 10–20 Ω·cm, n$^+$-type buried regions 42, 42, 42 having resistivity of about 10 Ω/□ are formed and n-type island regions 43, 43, 43 is formed by known epitaxial growth followed by acceptor diffusion to form p$^+$-type separation regions 44, 44, 44, 44. Then a deep p$^-$-type regions 54 and 45 of lower impurity concentration, for example 5×10$^{17}$ atoms/cm$^3$, are formed by ion implantation process. The p$^-$-type region 45 serves as a common base region of the three output transistors of the integrated injection logic IIL and the p$^-$-type region 54 serves as guarding region for a resistor R. Next, a shallow p$^+$-type regions 55, 51, 46 and 47 of higher impurity concentration, for example 2×10$^{18}$ atoms/cm$^3$, are formed by known diffusion process. Thereafter most shallow n$^+$-type regions 52, 53, 48, 49 and 50 are formed by known diffusion process. The p$^+$-type regions 46 and 47 form the emitter and collector of the pnp injector transistor of the integrated injection logic IIL, and the n$^+$-type regions 48, 49 and 50 form collector regions of the inverted fan-out transistors of the IIL. The n-type region 43 form the common connected emitters of the inverted fan-out transistors and also the base region of the injector transistor of IIL. In the npn high frequency bipolar transistor Tr at the center part, the n-type epitaxial growth region 43 forms the collector region, the p$^+$-type diffused region 51 forms the base region and the n$^+$-type diffused region 52 forms the emitter region and the n$^+$-type region 53 forms a collector contact region. In the resistor part R at the left part, the p$^+$-type region 55 forms resistor guarded by the p$^-$-type surrounding region 54. Since the deep p$^-$-type region 54 is of low impurity concentration, its resistivity is about 3 KΩ/□. Numerals 57, 58, 59, 60, 61, 62, 63, 64, 65 and 66 designate electrodes connected onto the respective diffused regions. In the resistor part R, the resistance is substantially determined by the resistivity of the p$^+$-type region 55, and an isolating p-n junction for the resistor R is formed between the p$^-$-type region 54 and the island region 43. Since the resistor part has the guard region 54 of p$^-$-type having diffusion depth of about 1.7–2.0 μm outside the p$^+$-type region 55 having diffusion depth of about 0.8–1.0 μm. Since the diffusion depth of the p$^-$-type region 54 is deep, the radius of curvature at its peripheral bottom β is large in comparison with that of the p$^+$-type region 55, the electric field at the peripheral bottom β of the p$^-$-type region 54 is considerably low thereby improving insulation of the resistor.

Figure 2:
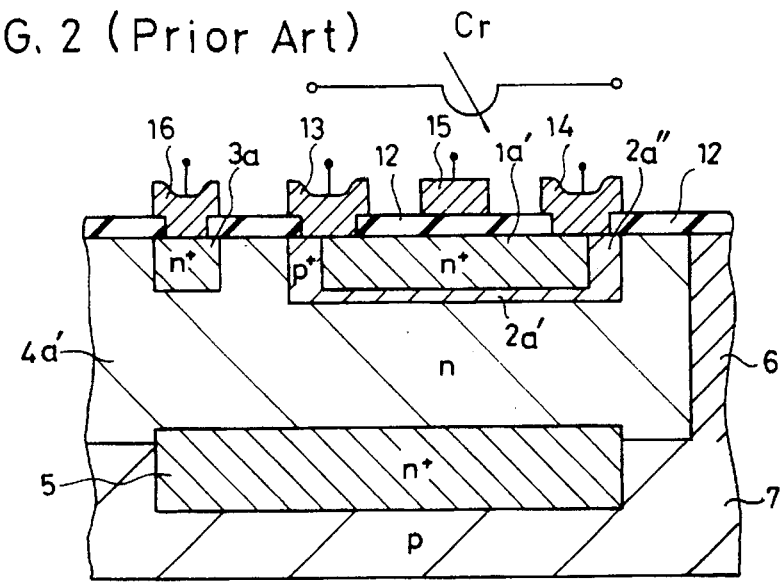
FIG. 2 is the sectional elevation view showing the construction of another part of the conventional IC.
Figure 3:
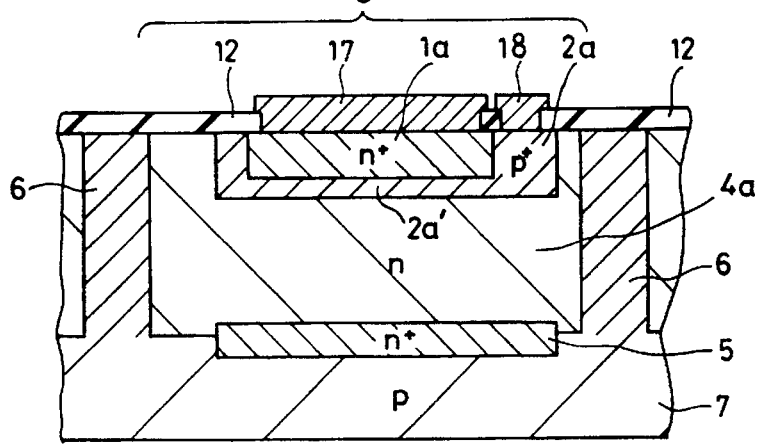
FIG. 3 is the sectional elevation view showing the construction of still another part of the conventional IC.
Figure 4:
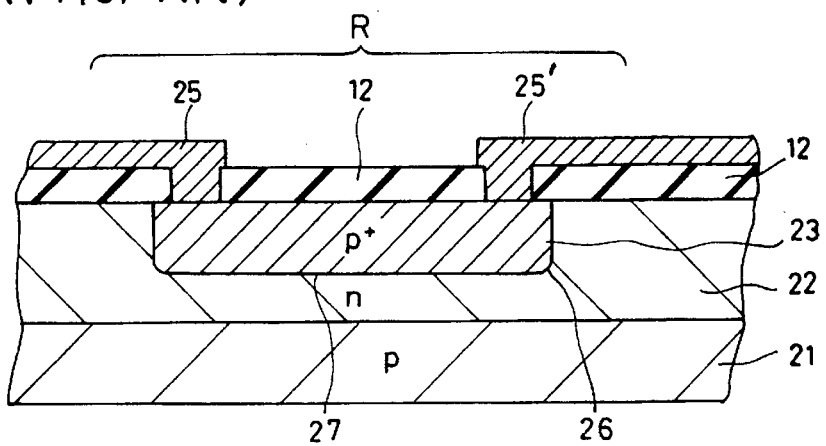
FIG. 4 is the sectional elevation view showing the construction of further still another part of the conventional IC.

FIG. 6(A) shows distribution of impurity concentration with respect to depth from the surface of a part of the resistor part R of the FIG. 4 of the conventional IC. As shown by FIG. 6(A), the conventional resistor part R has a simple p$^+$-type layer 23, and therefore the thickness of the part of the impurity concentration of below 10$^8$/cm$^3$ is only about 0.2 μm, and therefore, such thin low impurity layer part could not serve to isolate the resistor region from the effect of depletion layer to be formed near the p-n junction 27 of FIG. 4.

FIG. 6(B) shows distribution of the impurity concentration with respect to depth from the surface of the resistor part R comprising the p$^+$-type region 55 and the p$^-$-type region 54 of the IC of FIG. 5 embodying the present invention. In this construction, as shown by FIG. 6(B), besides the higher impurity concentration part near the surface, a very thick region (54 of FIG. 5) of the low impurity concentration of below 10$^{18}$/cm$^3$ is formed in the deeper side, and such thick low impurity concentration region 54 serves sufficiently to isolate the resistor layer 55 from the adverse effect of the depletion layer to be formed near the p-n junction α. Therefore, the voltage dependency of the resistance is substantially eliminated. Since the deep p$^-$-type region 54 is formed simultaneously with forming of the p$^-$-type region of the base region 45 of the IIL, there is no substantial increase of cost of manufacturing. The IIL provided with such deep p$^-$-type region is advantageous in attaining a high h$_{fe}$ which is required in the use for a large number of fan-out of the IIL, and recently such deep p$^-$-type region has been widely used besides the p$^+$-type region in the IIL.

EXAMPLE 2

Figure 7:
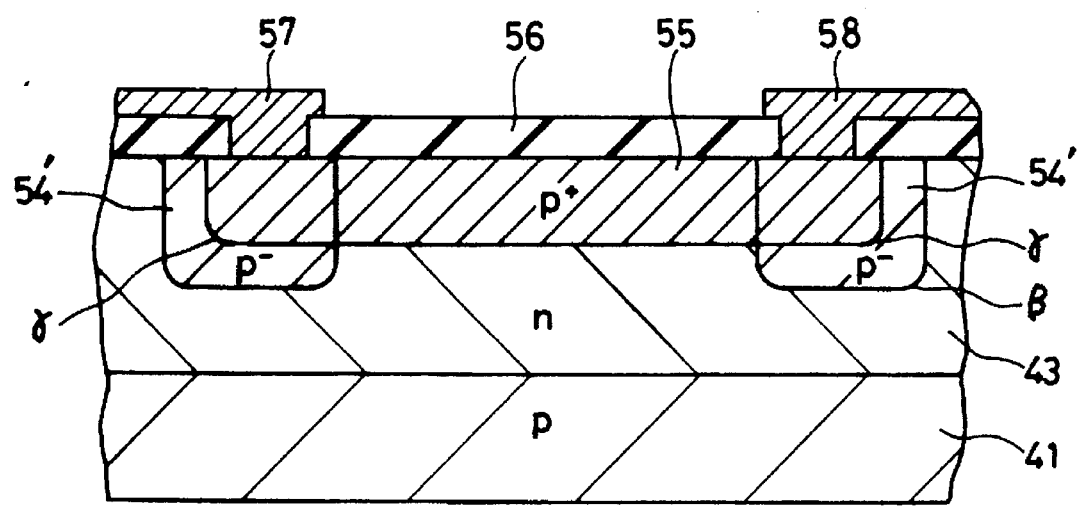
FIG. 7 is a sectional elevation view showing the construction of another part of the IC of FIG. 5.

FIG. 7 shows construction of another part of the IC as a construction of a second example, wherein the deep-diffused lower impurity p$^-$-type region 54' is formed only partly, in a manner to cover the peripheral bottom part β of the resistor region of p$^+$-type region 55. It is substantially enough that, in order to increase insulation of the resistor part R, the coverage by the p$^-$-type region of larger radius of curvature be made for the peripheral bottom part β of the resistor region 55, with other parts for example central bottom part uncovered by the p$^-$-type region. Details of the construction, that is, depth of the regions, impurity concentrations, etc., may be substantially the same with the previous example of FIG. 5.

EXAMPLE 3

Figure 8:
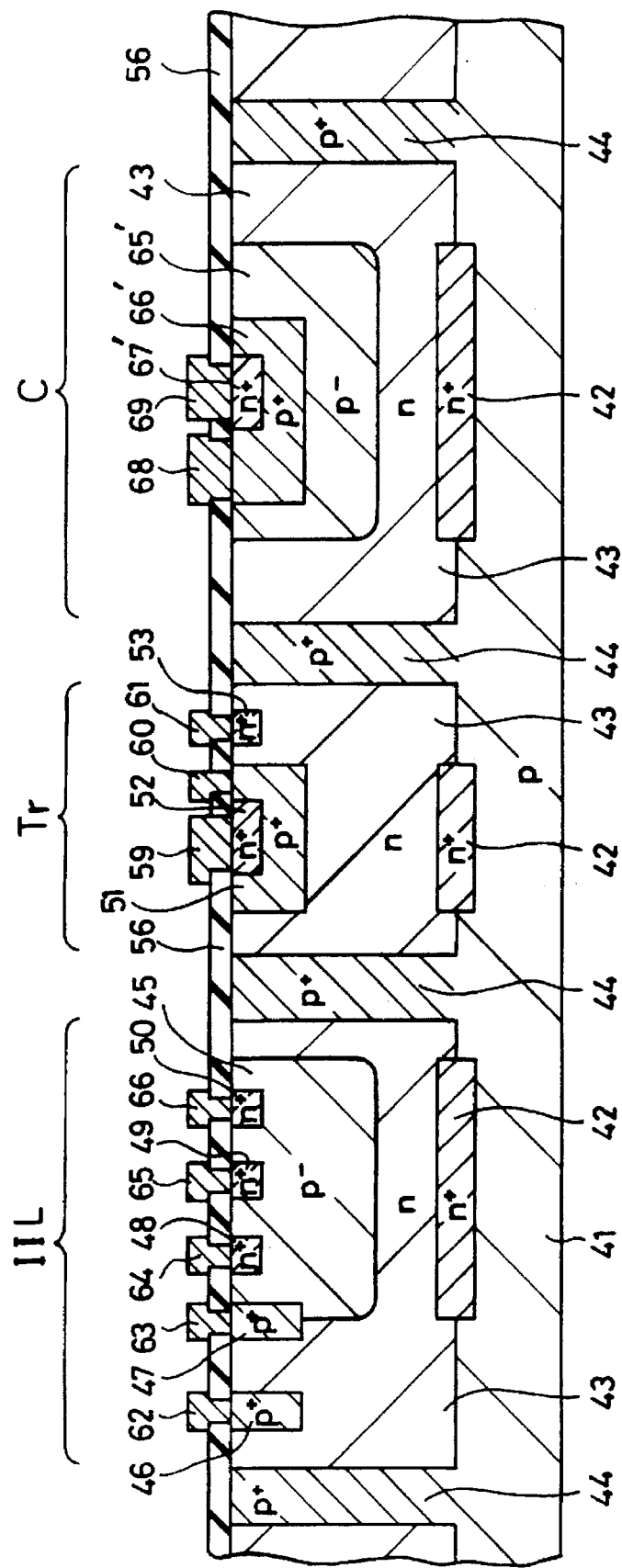
FIG. 8 is a sectional elevation view showing the construction of still another part of the IC of FIG. 5.

FIG. 8 shows another part of the IC as a construction of a third example, wherein the right part shows a capacitor part, the center part shows a high frequency npn bipolar transistor and the left part shows an integrated injection logic having fan-out of three.

On a p-type silicon substrate having resistivity of about 10–20 Ω·cm, n$^+$-type buried regions 42, 42, 42 having resistivity of about 10 Ω/□ are formed and n-type island regions 43, 43, 43 are formed by known epitaxial growth followed by acceptor diffusion to form p$^+$-type separation regions 44, 44, 44, 44. Then deep p$^-$-type regions 65' and 45 of lower impurity concentration, for example 5×10$^{17}$ atoms/cm$^3$, are formed by ion implantation process. The p$^-$-type region 45 serves as a common base region of the three output transistors of the integrated injection logic IIL and the p$^-$-type region 65' serves as guarding region of a capacitor C. Next, a shallow p$^+$-type regions 66', 51, 46 and 47 of higher impurity concentration, for example 2×10$^{18}$ atoms/cm$^3$, are formed by a known diffusion process. Thereafter shallow n$^+$-type regions 67', 52, 53, 48, 49 and 50 are formed by a known diffusion process. The p$^+$-type regions 46 and 47 form the emitter and collector of the pnp injector transistor of the integrated injection logic IIL, and the n$^+$-type regions 48, 49 and 50 form collector regions of the inverted fan-out transistors of the IIL. The n-type region 43 forms the common connected emitters of the inverted fan-out transistors and also the base region of the injector transistor of the IIL. In the npn high frequency bipolar transistor npn Tr at the center part, the n-type epitaxial growth region 43 forms the collector region, the p$^+$-type diffused region 51 forms the base region and the n$^+$-type diffused region 52 forms the emitter region, and the n$^+$-type region 53 forms a collector contact region. In the capacitor part C at the right part, a p-n junction formed between the p$^+$-type region 66' and the n$^+$-type region 67' serves as capacitor, and the p$^+$-type region 66' is guarded by the p$^-$-type surrounding region 65'. Since the deep p$^-$-type region 65' is of low impurity concentration, its resistivity is about 3 KΩ/□. Numerals 59, 60, 61, 62, 63, 64, 65, 66, 68 and 69 designate electrodes connected onto the respective diffused regions. The deterioration of the characteristics of the capacitor in the conventional IC has been largely made by the CE leak. This is usually caused by crystal imperfection due to precipitation of metal or the like in the thin $p^+$-type region, which makes penetration of the $p^+$-type region. Such penetration, namely the CE leak produces leakage current or effective deterioration of the capacitor. However, in the IC embodying the present invention, the CE leak is eliminated by providing a thick guard region 65' around the capacitor part. Since the $n^+$-type region 67' and the $p^+$-type region 66' directly contact each other forming the p-n junction for the capacitor, a sufficient capacitance per unit area of p-n junction is obtainable. That is, the composite construction of the $p^+$-type region 66' and the guarding $p^-$-type region 65' is advantageous to attain reliability of insulation as well as sufficient capacitance per size.

The construction of FIG. 8 is further advantageous in decreasing parastic capacitance at the second p-n junction formed between the $p^-$-type region 65' and the n-type region 43. The decrease of the parasitic capacitance is attainable since the resistivity of the $p^-$-type region is considerably high, and the decrease is advantageous in circuit design by eliminating adverse effect of cross-talk of signal. The deep $p^-$-type region 65' is formed simultaneously with forming of the $p^-$-type region of the base region 45 of the IIL, there is no substantial increase of cost of manufacturing. The IIL provided with such deep $p^-$-type region is advantageous in attaining a high $h_{fe}$, which is required in the use for a large number of fan-out of the IIL, and recently such deep $p^-$-type region has been widely used besides the $p^+$-type region in the IIL. The deep $p^-$-type regions 45 and 65' can be made by ion-implantation process or doped oxide process. By the construction embodying the present invention, such high $h_{fe}$ of 300 to 700 at the IIL part, and 10 to 15 of $h_{fe}$ value of the inverted transistors of the IIL are attainable.

EXAMPLE 4

Figure 9:
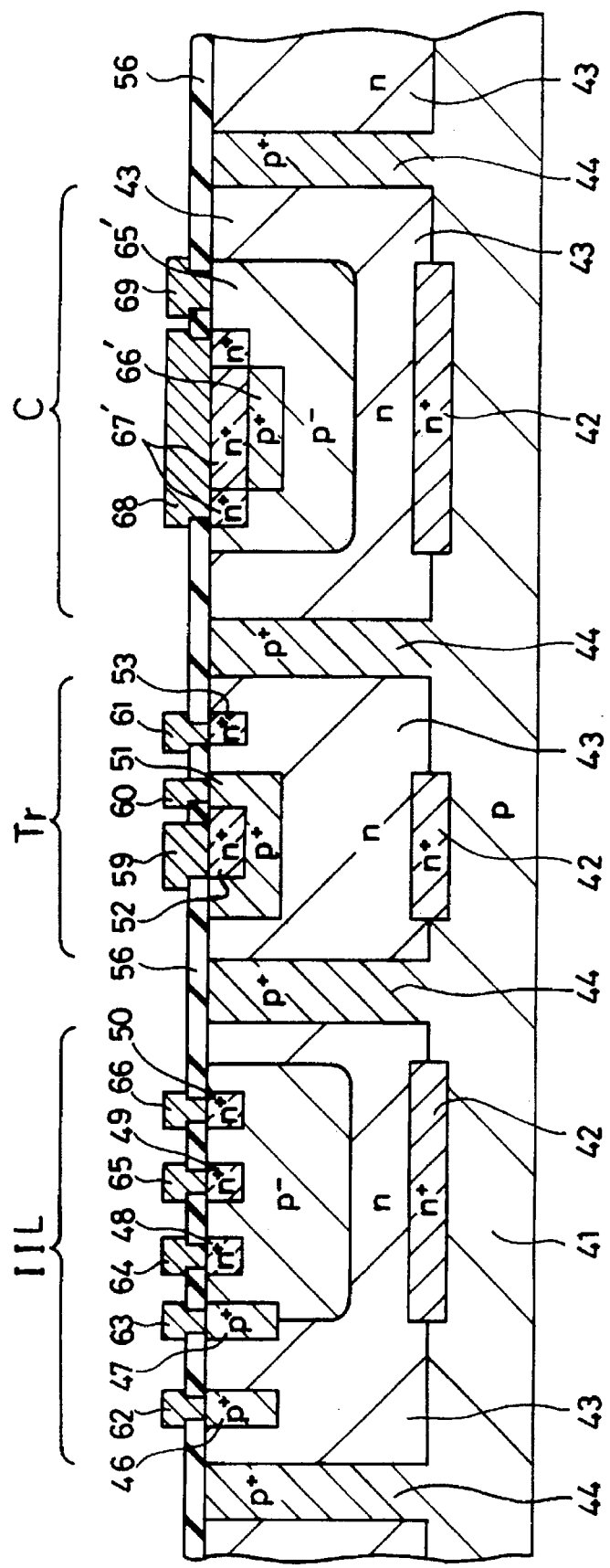
FIG. 9 is a sectional elevation view showing the construction of further still another part of the IC of FIG. 5.

FIG. 9 shows another part of the IC as a construction of a fourth example, wherein the right part shows a capacitor part, the center part shows a high frequency npn bipolar transistor and the left part shows an integrated injection logic having fan-out of three. Almost parts are constructed similar as the construction of FIG. 8, but the construction of the capacitor part C is a little improved from that of FIG. 8. The improvement is that a $n^+$-type region 67' is formed wider than a $p^+$-type region 66'. The advantage of this construction is as follows:

In general, the peripheral bottom of an $n^+$-type region diffused in a $p^+$-type region is liable to deterioration thereby causing decrease of breakdown voltage, since electric field intensity is strong there. In order to avoid such weakness at the peripheral bottom corner of the $n^+$-type region, the peripheral bottom corner of the $n^+$-type region 67' is made to contact the $p^-$-type region 65' instead of the $p^+$-type region 66'. This p-n junction is more reliable than the junction between the $p^+$-region and the $n^+$-region, and has a high breakdown voltage even at the corner curvature at the peripheral bottom part. On the other hand, the p-n junction between the $p^+$-type region 66' and the $n^+$-type region 67' is formed flat, and therefore has a sufficiently high breakdown voltage. As a result of the above-mentioned utilization of the $p^-$-type region 65', the capacitor part C of the example of FIG. 9 can achieve 20 to 30% higher breakdown voltage than conventional construction, and the leak current becomes drastically decreased.

EXAMPLE 5

Figure 10:
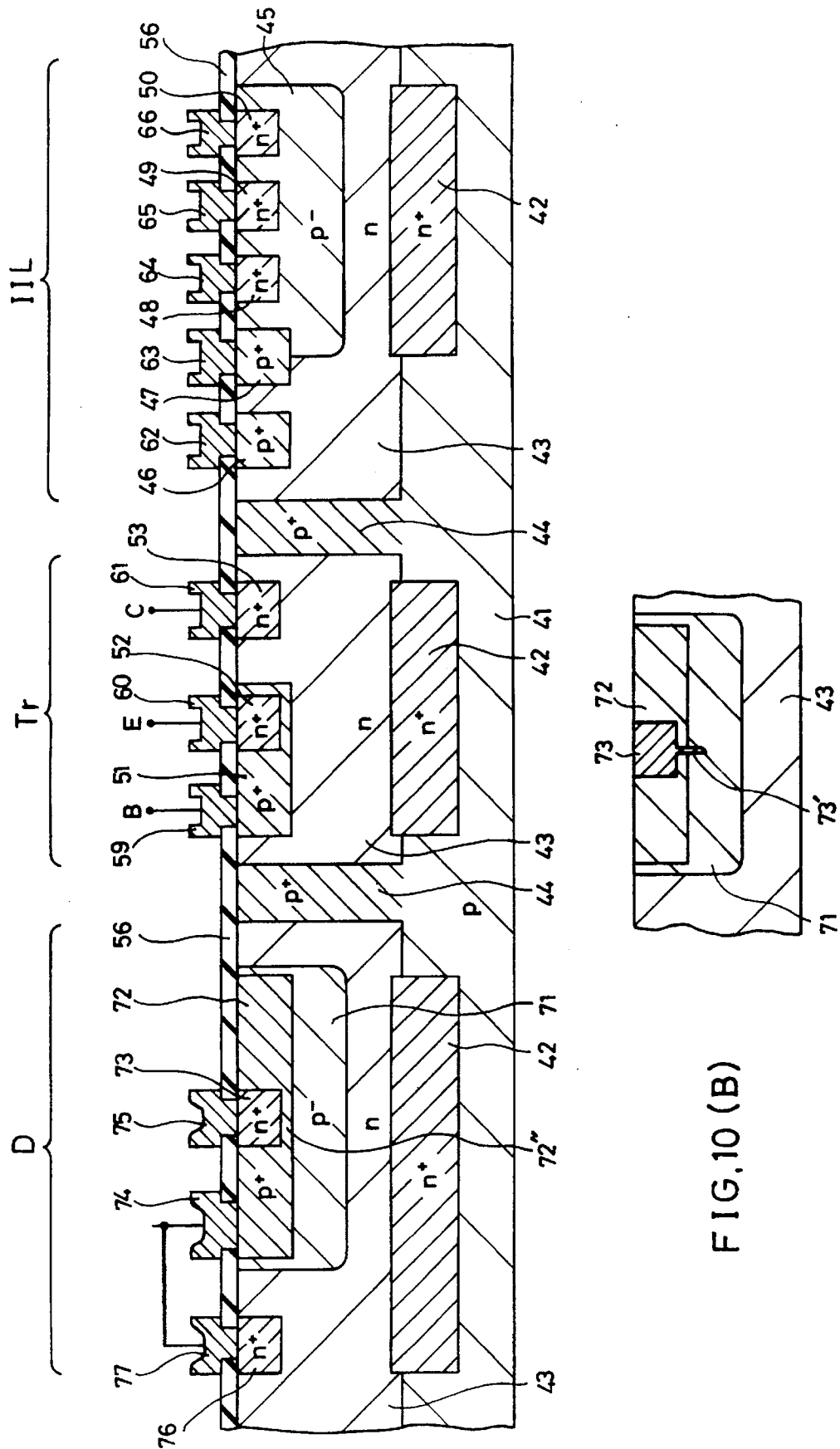
FIG. 10(A) is a sectional elevation view showing the construction of further still another part of the IC of FIG. 5.
FIG. 10(B) is a sectional elevation view of a part of the IC of FIG. 10(A) for explanation of the CE leak.

FIG. 10 shows construction of another part of the IC as a fifth example, wherein the left part shows a diode part, the center part shows a high frequency npn bipolar transistor and the right part shows an integrated injection logic having fan-out of three. The parts other than the diode part, namely the high frequency bipolar transistor part Tr and the integrated injection logic IIL, are constructed similar to the previous examples of FIG. 9. In the diode part D, the n-type island region 43 is epitaxially grown on the monolithic substrate 41. In the island region 43, a deep $p^-$-type region 71 of a low impurity concentration is formed. Further, in the $p^-$-type region 71, a shallower $p^+$-type region 72 of a high impurity concentration is formed, and therein a more shallower $n^+$-type region 73 is formed. The $p^+$-type region 72 forms p-side region and the $n^+$-type region 73 forms n-side region, respectively, of the diode, and electrodes 74 and 75 are connected thereto. An $n^+$-type contact region 76 is formed in the island region 43. The $p^-$-type region 71 is formed simultaneously with the $p^-$-type region 45 of the integrated injection logic IIL, the $p^+$-type region 72 is formed simultaneously with the $p^+$-type region 51 of the high frequency bipolar transistor Tr and the $p^+$-type regions 46 and 48 of the integrated injection logic IIL.

Since the diode D has the deep $p^-$-type guard region 71 so as to surround the $p^+$-type region 72, it is free from accidental shortcircuiting due to a CE leak, which has been hitherto likely to take places in the thin remaining layer 72" under the $n^+$-type region 73, when such $p^-$-type region 71 has not yet provided. In the construction of FIG. 10(A), respective regions are formed as follows:

| | |
|---|---|
| p-type region 71 | average impurity concentration: $1 \times 10^{16}/cm^3$ |
| | average resistivity: 2.5K $\Omega/\square$ |
| | depth of diffusion front: 2 μm |
| $p^+$-type region 72 | average impurity concentration: $5 \times 10^{17}/cm^3$ |
| | average resistivity: 200 $\Omega/\square$ |
| | depth of diffusion front: 0.8 μm |
| $n^+$-type region 73 | average impurity concentration: $1 \times 10^{20}/cm^3$ |
| | average resistivity: 10 $\Omega/\square$ |
| | depth of diffusion front: 0.6 μm, | then the integrated value of the impurity of the active region 72" of the base region 72, which value determines the injection efficiency of the diode D, is given by the data of the $p^+$-type region 72, since the ratio of the impurity concentration of the $p^+$-type region 72 and the $p^-$-type region 71 is about 10:1. Therefore, the injection efficiency of the diode D is substantially equivalent to a case where the part of the $p^-$-type region is also made of $p^+$-type region. Therefore, the voltage and current of the diode are not effected by the providing of the $p^-$-type region 71, and the current can be accurately controlled.

EXAMPLE 6

Figure 11:
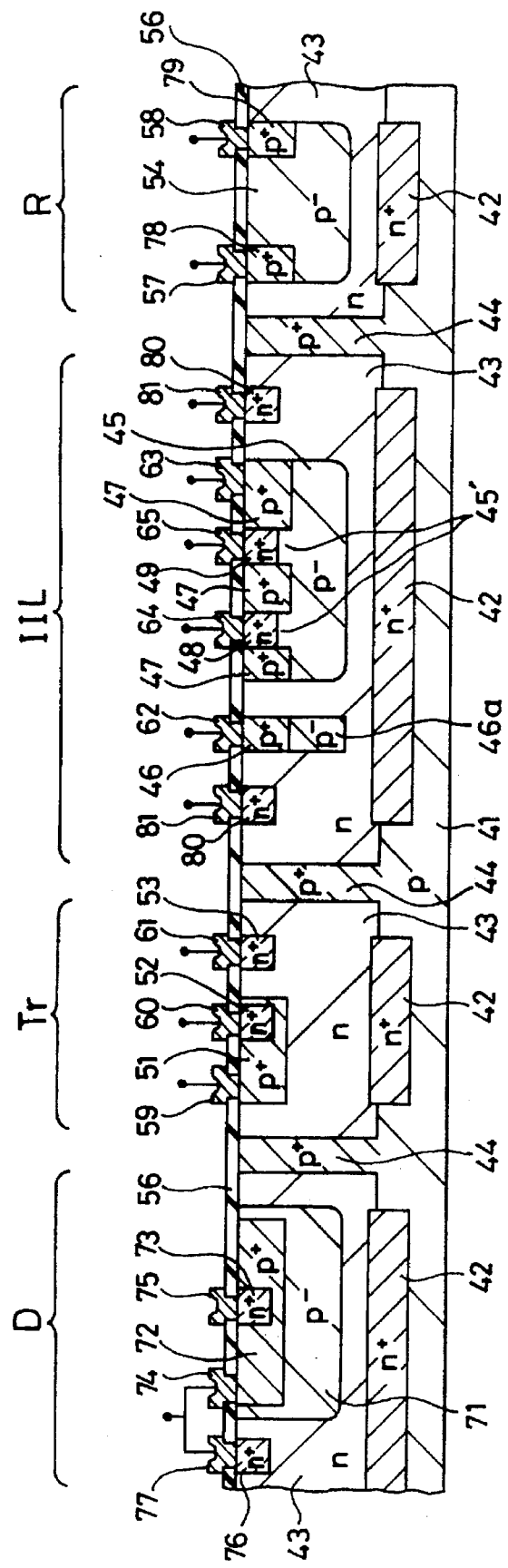
FIG. 11 is a sectional elevation view showing the construction of further still another part of the IC of FIG. 5.

FIG. 11 shows construction of another part of the IC as a sixth example, wherein the left part D shows a diode part, the center-left part Tr shows a high frequency npn bipolar transistor, the center-right part IIL shows an integrated injection logic having fan-out of two and the right part R shows a resistor. The parts other than the resistor part R, namely the diode D, the high frequency bipolar transistor part Tr and the integrated injection logic IIL, are constructed almost similar to the previous example of FIG. 10. In the resistor part R, a high resistance is given by the p⁻-type low impurity regions 54, which is formed simultaneously with the p⁻-type regions 45, 46 and 71. A pair of p⁺-type regions 78 and 79 are contact regions provided at both ends of the high sheet resistance p⁻-type region 54, and electrodes 57 and 58 are connected thereto.

Further modifications are made in the integrated injection logic IIL of FIG. 11, where the injector region is made by combined p⁻-type region 46a and p⁺-type region 46. The p⁻-type region 46a is made simultaneously with the p⁻-type regions 71, 45 and 54, and the p⁺-type region 46 is made simultaneously with the p⁺-type regions 72, 51, 47, 47, 47, 78 and 79. The p⁺-type region 47, 47, 47 form a part of the base region. In the integrated injection logic IIL of FIG. 11, the active base regions of the inverted transistors are formed by the thick p⁻-type region 45, and therefore, the current amplification factor is as high as 2 to 3 times of a case where the active base region is formed by p⁺-type region. Furthermore, since the p⁻-type region 36 is as deep as 2 μm, the part 45' of the active base regions which is immediately under the n⁺-type collector regions 48 and 49 can be made such thick as 1 μm or more. Therefore, even if the depth of the n⁺-type regions scatters from 0.1 μm to 0.2 μm, the current amplification factor does not changes, and a uniformly controlled performance is obtainable. Furthermore, as a result of the use of p⁻-type region 45, the junction capacity between the emitter and base of the inverted transistors of the integrated injection logic IIL can be reduced by about 60% in comparison with the conventional cases, and accordingly, a high operation speed is attainable.

In the resistor part R of FIG. 11, as a result of adoption of the high resistivity p⁻-type region 54, such a high sheet resistance of about 2.5 KΩ/□, which is as high as about 10 times of that of the ordinary bipolar IC, the necessary area for the resistor part R can be decreased to about one tenth of the conventional case, thereby enabling higher integration of IC.

EXAMPLE 7

Figure 12:
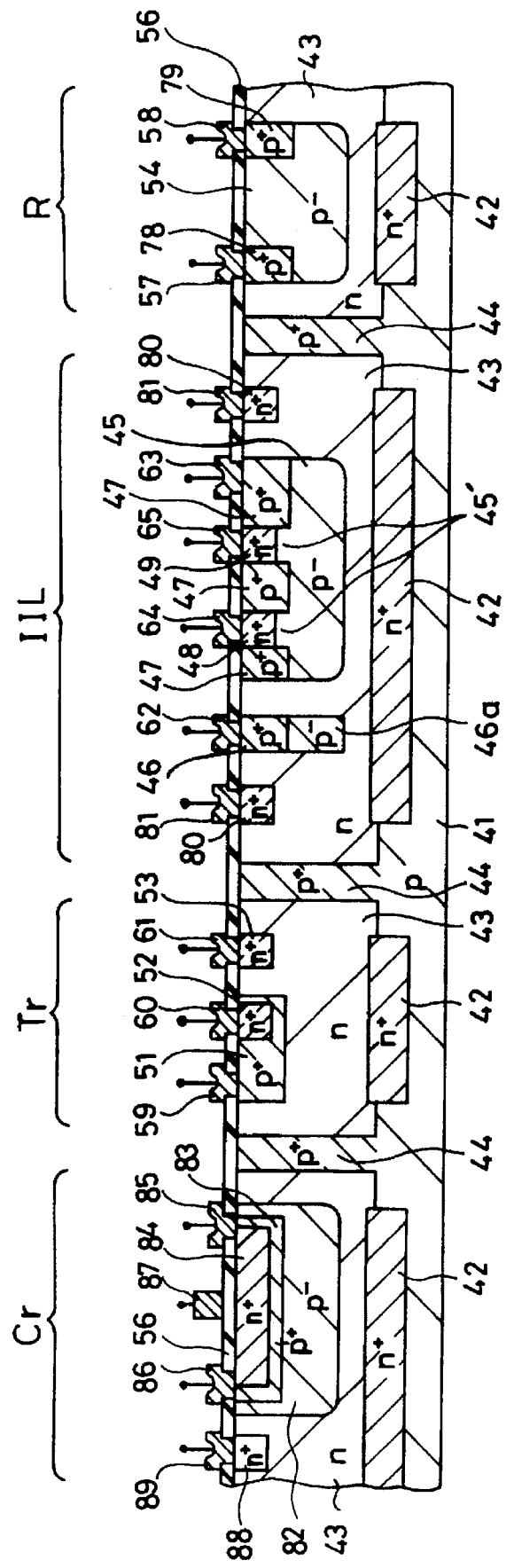
FIG. 12 is a sectional elevation view showing the construction of further still another part of the IC of FIG. 5.

FIG. 12 shows construction of another part of the IC as a seventh example, wherein the left part Cr shows an isolated crossing connection part, the center-left part Tr shows a high frequency npn bipolar transistor, the center-right part IIL shows an integrated injection logic having fan-out of two and the right part R shows a resistor. The part other than the isolated crossing connection part, namely, the diode D, the high frequency bipolar transistor part Tr, integrated injection logic IIL and the resistor part R, are constructed similar to the previous example of FIG. 11. In the isolated crossing connection part Cr, a deep p⁻-type region 82 is formed in an island region 43 of the isolated crossing connection part Cr, at the same time with forming of the p⁻-type regions 46a, 45 and 54. Then, a shallower p⁺-type region 83 is formed in the p⁻-type region 82, at the same time with the p⁺-type regions 51, 46, 47, 47, 47, 78 and 79. The n⁺-type region 84 is formed at the same time with the n⁺-type regions 52, 53, 80, 48, 49 and 80. A pair of electrodes 85 and 86 are provided to be connected to both ends of the p⁺-type region 83 and at the same time to both ends of the n⁺-type region 84. An electrode 89 is connected to the island region 43 through an n⁺-type connection region 88 formed therein. The n⁺-type region 84 enclosed in the p⁺-type region 83 forms isolated crossing connection, which is isolated by an insulation film 56 from the over-riding metal wiring 87 running crosswise of the connection regions 83 and 84.

As shown in FIG. 12, the isolated crossing connection Cr has the p⁻-type region 82 therein, and accordingly, even when an irregularity of the diffusion front of the n⁺-type region 84 or p⁺-type region 83 takes place, it does not reach the n-type region 43, and hence no CE leak occurs. In the isolated crossing connection part, on the electrode 89 is impressed a potential lower than that on the terminals 86 and 85, and thereby a p-n junction between the p⁻-type region 82 and the n-type island region 43 is inverse-biased to isolate the crossing connection regions 83 and 84. In such case, the junction capacitance becomes a parasitic capacitance, which should be as small as possible in view of operation speed. In this construction of the crossing connection, due to high resistivity of the p⁻-type region 82, the parasitic capacitance is small. For example, in the isolated crossing connection having the following data:

| | |
|---|---|
| p⁺-type region 83 | average impurity concentration: $5 \times 10^{17}/cm^3$, |
| p⁻-type region 82 | average impurity concentration: $1 \times 10^{16}/cm^3$, |
| n-type region 43 | average impurity concentration: $5.5 \times 10^{15}/cm^3$, (for about 1 Ω · cm), | the junction capacitance can be decreased by about 60% in comparison with conventional ones, which does not has such p⁻-type region. If in the conventional case the depth of the p⁺-type region 83 of 200 Ω/□ is formed to have 2 μm depth, the average impurity concentration of the p⁺-type region is $2.5 \times 10^{17}/cm^3$, and this concentration is far larger than the impurity concentration of $5.5 \times 10^{15}/cm^3$ of the n-type region 43. Therefore, the junction capacitance is determined principally by the impurity concentration of the n-type region 84, and this is larger than the case of the construction of FIG. 12. Since the p⁻-type region 82 is formed at the same time with the other p⁻-type regions 46a, 45 and 54, there is no substantial increase of cost for providing the p⁻-type region 82.

As has been elucidated referring to various examples, the IC embodying the present invention has many advantages in increasing reliabilities and improving characteristics of the circuit elements such as resistors capacitors, diodes and isolated crossing connections, by effective utilization of the p⁻-type regions which can be formed simultaneously with the p⁻-type region in the IIL.

What is claimed is:

1. A method of fabricating a semiconductor integrated circuit, comprising the steps of:
   (a) forming an n-type semiconductor layer on an upper surface of a p-type semiconductor substrate, said n-type semiconductor layer including an n-type first region and an n-type second region;
   (b) forming a p⁻-type third region in said n-type second region from an upper surface of said n-type second region;
   (c) simultaneously forming a p⁺-type fourth region and a p⁺-type fifth region in said n-type first region and said p⁻-type third region as upper surfaces of said n-type first region and said p⁻-type third region, respectively; and
   (d) simultaneously forming an n⁺-type sixth region and an n⁺-type seventh region in said p⁺-type fourth region and said p⁺-type fifth region, respectively, from upper surfaces of said p⁺-type fourth region and said p⁺-type fifth region in a manner such that:
      (i) said n⁺-type seventh region is formed within said p⁺-type fifth region to form a p-n junction which establishes a capacitor, and (ii) said $n^+$-type sixth region is formed within said $p^+$-type fourth region in a way such that said n-type first region, said $p^+$-type fourth region, and said $n^+$-type sixth region form an npn type vertical bipolar transistor;

said $p^-$-type third region forming a guarding region which isolates said $p^+$-type fifth region from said n-type second region.

2. A method in accordance with claim 1, wherein:

said n-type first region is a collector region of said npn type vertical bipolar transistor;

said $p^+$-type fourth region is a base region of said npn type vertical bipolar transistor; and said $n^+$-type sixth region is an emitter region of said npn type vertical bipolar transistor.

3. A method of fabricating a semiconductor integrated circuit, comprising the steps of:

(a) forming an n-type semiconductor layer on an upper surface of a p-type semiconductor substrate, said n-type semiconductor layer including an n-type first region and an n-type second region;

(b) forming a $p^-$-type third region in said second region from an upper surface of said second region;

(c) simultaneously forming a $p^+$-type fourth region and a $p^+$-type fifth region in said n-type first region and said $p^-$-type third region, respectively, as upper surfaces of said n-type first region and said $p^-$-type third region;

(d) simultaneously forming an $n^+$-type sixth region and an $n^+$-type seventh region in said $p^+$-type fourth region and said $p^+$-type fifth region, respectively, from upper surfaces of said $p^+$-type fourth region and said $p^+$-type fifth region in a manner such that:

(i) said $n^+$-type seventh region is formed within said $p^+$-type fifth region, (ii) said $n^+$-type sixth region is formed within said $p^+$-type fourth region, and (iii) said n-type first region, said $p^+$-type fourth region and said $n^+$-type sixth region form an npn type vertical transistor;

(e) forming an insulation layer on said $n^+$-type seventh region; and (f) simultaneously forming a first pair of electrode contacts and a second electrode contact onto said $n^+$-type seventh region and said insulation layer in a manner such that an electrical connection between said first pair of electrode contacts crosses and is isolated from said second electrode contact;

said $p^-$-type third region forming a guarding region which isolates said $p^+$-type fifth region from said n-type second region.

4. A method in accordance with claim 3, wherein:

said n-type first region is a collector region of said npn type vertical bipolar transistor;

said $p^+$-type fourth region is a base region of said npn type vertical bipolar transistor; and said $n^+$-type sixth region is an emitter region of said npn type vertical bipolar transistor.

* * * * *